(12) United States Patent
Tuen et al.

(10) Patent No.: US 9,263,355 B2
(45) Date of Patent: Feb. 16, 2016

(54) ELECTRONIC SIGNAL TRANSMITTING DEVICE AND INTEGRATED CIRCUIT THEREOF

(71) Applicant: Wistron Corporation, New Taipei (TW)

(72) Inventors: Lung-Fai Tuen, New Taipei (TW); Chi-Fang Weng, New Taipei (TW); Wei-Cheng Lin, New Taipei (TW); Hong-Kuei Lee, New Taipei (TW); Wei-Shuen Chang, New Taipei (TW); Wei-Shen Chu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 276 days.

(21) Appl. No.: 14/023,471

(22) Filed: Sep. 11, 2013

(65) Prior Publication Data

US 2015/0009630 A1    Jan. 8, 2015

(30) Foreign Application Priority Data

Jul. 2, 2013    (TW) .............................. 102123658 A

(51) Int. Cl.
*H05K 7/20*    (2006.01)
*H01L 23/00*    (2006.01)
*H01F 27/02*    (2006.01)
(Continued)

(52) U.S. Cl.
CPC ................ *H01L 23/00* (2013.01); *H01F 27/02* (2013.01); *H01F 27/34* (2013.01); *H01L 2924/0002* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/46–23/467

USPC ....................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236

See application file for complete search history.

(56) References Cited

U.S. PATENT DOCUMENTS

| 5,430,613 | A | * | 7/1995 | Hastings | ............... | H01F 1/0027 |
| | | | | | | 29/606 |
| 6,054,676 | A | * | 4/2000 | Wall et al. | ..................... | 219/209 |

(Continued)

FOREIGN PATENT DOCUMENTS

TW        201220349        5/2012

OTHER PUBLICATIONS

Office action mailed on May 28, 2015 for the Taiwan application No. 102123658, filing date: Jul. 2, 2013, p. 2 line 2~26, p. 3 and p. 4 line 1~17.

*Primary Examiner* — Anthony Haughton
*Assistant Examiner* — Razmeen Gafur
(74) *Attorney, Agent, or Firm* — Winston Hsu; Scott Margo

(57) ABSTRACT

An electronic signal transmitting device is disposed in a housing of an integrated circuit. The integrated circuit includes at least one first signal end and at least one second signal end. The electronic signal transmitting device includes at least one electromagnetic transmitting unit, coupled between the first signal end and the second signal end for transmitting an electronic signal between the first signal end and the second signal end; and an electromagnetic insulating layer covering the electromagnetic transmitting unit for protecting the integrated circuit from electromagnetic interference.

12 Claims, 3 Drawing Sheets

(51) Int. Cl.
*H01F 27/34* (2006.01)
*H01L 23/473* (2006.01)

(56) References Cited

U.S. PATENT DOCUMENTS

| | | | | |
|---|---|---|---|---|
| 6,395,983 | B1 * | 5/2002 | Gutierrez | H01L 23/057 174/551 |
| 6,486,868 | B1 * | 11/2002 | Kazarian | G06F 3/0213 345/156 |
| 7,060,611 | B1 * | 6/2006 | Lin | H01F 41/10 438/660 |
| 7,326,084 | B1 * | 2/2008 | Chen | H01R 13/6608 439/620.23 |
| 7,940,154 | B2 * | 5/2011 | Chow | H01F 27/027 336/192 |
| 8,125,777 | B1 * | 2/2012 | MacLennan | H01F 27/10 310/208 |
| 8,349,648 | B2 | 1/2013 | Kim | |
| 8,854,167 | B2 * | 10/2014 | Lin | H05K 5/0095 336/200 |
| 8,897,029 | B2 * | 11/2014 | Kippley | H02M 3/00 361/740 |
| 8,923,010 | B2 * | 12/2014 | Parish | H05K 1/145 361/752 |
| 8,953,335 | B2 * | 2/2015 | Abe et al. | 361/761 |
| 2006/0057889 | A1 * | 3/2006 | Saitou | 439/620 |
| 2006/0284717 | A1 * | 12/2006 | Iverson | H01F 27/2804 336/200 |
| 2007/0194875 | A1 * | 8/2007 | Wang | H01F 27/027 336/199 |
| 2009/0201648 | A1 * | 8/2009 | Ganev | H05K 7/209 361/707 |
| 2009/0207566 | A1 * | 8/2009 | Appel | H02M 3/00 361/692 |
| 2009/0251851 | A1 * | 10/2009 | McGill, Sr. | H05K 7/186 361/623 |
| 2009/0273908 | A1 * | 11/2009 | Tsao | H01F 27/022 361/748 |
| 2010/0002398 | A1 * | 1/2010 | Braunisch et al. | 361/718 |
| 2011/0140823 | A1 * | 6/2011 | Lin | H01F 27/027 336/90 |
| 2011/0304012 | A1 * | 12/2011 | Kim et al. | 257/531 |
| 2012/0026770 | A1 * | 2/2012 | West | H05K 7/209 363/131 |
| 2012/0050999 | A1 * | 3/2012 | Cooper | H02M 7/003 361/722 |
| 2012/0068468 | A1 * | 3/2012 | Roesner | H05K 7/20945 290/55 |
| 2012/0099277 | A1 * | 4/2012 | Yang | F28D 15/00 361/695 |
| 2012/0188712 | A1 * | 7/2012 | Ishibashi | H02M 7/003 361/688 |
| 2012/0195005 | A1 * | 8/2012 | Asano | H01F 27/22 361/710 |
| 2012/0236498 | A1 * | 9/2012 | Pal | H05K 7/20163 361/695 |
| 2013/0027170 | A1 * | 1/2013 | Chen | H01F 27/2804 336/200 |

* cited by examiner

ELECTRONIC SIGNAL TRANSMITTING DEVICE AND INTEGRATED CIRCUIT THEREOF

BACKGROUND OF THE INVENTION

1. Field of the Invention

The present invention relates to an electronic signal transmitting device and integrated circuit thereof for transmitting an electronic signal, and more particularly, to an electronic signal transmitting device and integrated circuit thereof with a high electro-static discharge (ESD) resistance.

2. Description of the Prior Art

With the advancement of technology, various kinds of electronic circuitry can be integrated/formed in a single chip. The electronic circuitry in an integrated circuit can be classified into core circuitry and input/output circuitry, which are both driven by power sources with different respective voltages. In order to allow the core circuit and input/output circuit to connect with the external power supplies, core power pads and input/output pads are configured in the integrated circuit.

Electro-static charges may easily enter the inside of the integrated circuit via the core power pads and the input/output pads when packing, testing, transporting or manufacturing the integrated circuit. When excessive amounts of charge enter the integrated circuit, an electro-static discharge phenomenon will occur. The electro-static discharge may cause the integrated circuit to work abnormally, and may even damage the electronic circuitry of the integrated circuit in a more serious situation. Thus, how to reduce the effect of electromagnetic discharge is an important topic to be discussed.

SUMMARY OF THE INVENTION

In order to solve the above problem, the present invention provides an electronic signal transmitting device and integrated circuit thereof with a high electro-static discharge resistance.

The present invention discloses an electronic signal transmitting device disposed in a housing of an integrated circuit. The integrated circuit comprises at least one first signal end and at least one second signal end. The electronic signal transmitting device comprises at least one electromagnetic transmitting unit, coupled between the first signal end and the second signal end for transmitting an electronic signal between the first signal end and the second signal end; and an electromagnetic insulating layer which covers the electromagnetic transmitting unit for protecting the integrated circuit from electromagnetic interference.

The present invention further discloses an integrated circuit, comprising a housing; at least one first signal end, configured at a first side of the housing; at least one second signal end, configured at a second side of the housing; and an electronic signal transmitting unit, configured in the housing, comprising at least one electromagnetic transmitting unit, coupled between the first signal end and the second signal end, for transmitting an electronic signal between the first signal end and the second signal end; and an electromagnetic insulating layer which covers the electromagnetic transmitting unit for protecting the integrated circuit from electromagnetic interference.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
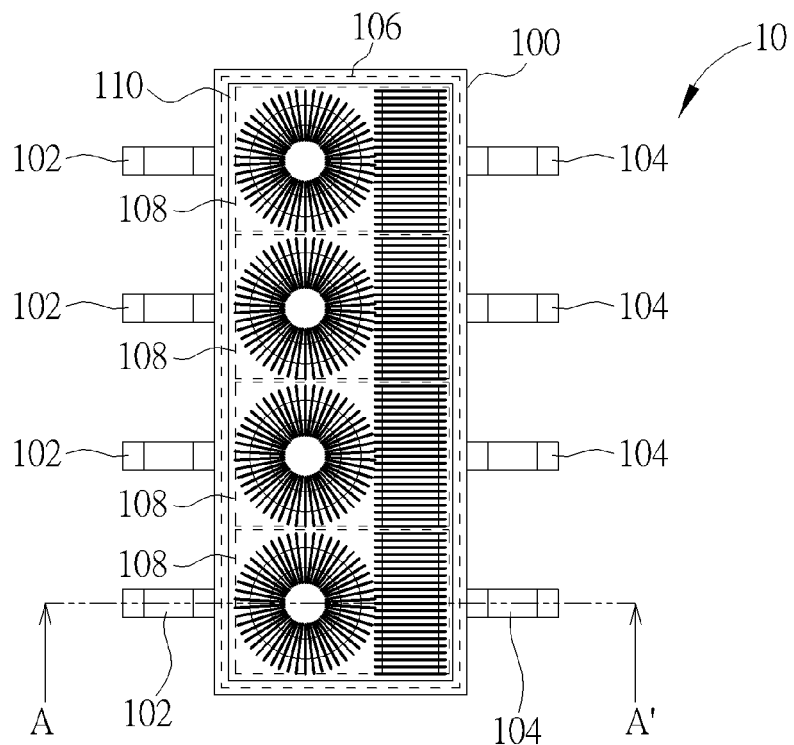
FIG. 1A is a schematic diagram of an integrated circuit according to an embodiment of the present invention.

Please refer to FIG. 1A, which is a schematic diagram of an integrated circuit 10 according to an embodiment of the present invention. As shown in FIG. 1A, the integrated circuit 10 comprises a housing 100, a plurality of first signal ends 102, a plurality of second signal ends 104 and an electronic signal transmitting device 106. The first signal ends 102 are configured at a side (e.g. the left side) of the housing 100 and the second signal ends 104 are configured at another side (e.g. the right side) of the housing 100. Please note that a number of the first signal ends 102 and a number of second signal ends 104 can be appropriately changed according to different system requirements and design concepts. The electronic signal transmitting device 106 is configured in the housing 100 and comprises a plurality of electromagnetic transmitting units 108 and an electromagnetic insulating layer 110. The electronic signal transmitting device 106 is utilized for transmitting an electronic signal ES between the plurality of first signal ends 102 and the plurality of second signal ends 104. Through the electromagnetic insulation characteristic of the electromagnetic insulating layer 110, the effect of the electro-static discharge (ESD) and electromagnetic interference (EMI) toward the integrated circuit 10 can be reduced. The electronic signal ES can therefore be steadily transmitted.

Figure 1B:
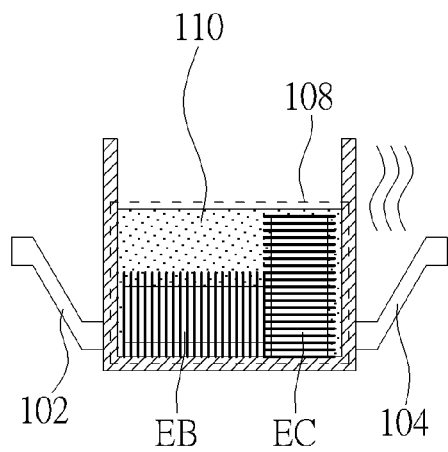
FIG. 1B is a cross-sectional view of the integrated circuit shown in FIG. 1A.

Please refer to FIG. 1B, which is a cross-sectional view of the integrated circuit 10 shown in FIG. 1A. Please note that FIG. 1B only shows a first signal end 102, a second signal end 104 and an electromagnetic transmitting unit 108 as an example. As shown in FIG. 1B, the electromagnetic transmitting unit 108 comprises a magnetizer EB and a magnetic coil EC twining round the magnetizer EB. When the integrated circuit 10 wants to transmits the electronic signal ES, the magnetizer EB and the magnetic coil EC form an electromagnetic transmitting state, for performing the transmission of the electronic signal ES. The electromagnetic insulating layer 110 is realized by electromagnetic insulation materials, such as varnish and insulating coating, and covers the magnetizer EB and the magnetic coil EC. Via the electromagnetic insulating layer 110, the magnetizer EB and the magnetic EC can be fixed. Moreover, a capacitance between the first signal end 102 and the second signal end 104 can be increased via using the electromagnetic insulating layer 110 to cover the magnetizer EB and the magnetic coil EC. The resistance of the electro-static discharge and the electromagnetic interference can thereby be improved.

Figure 2:
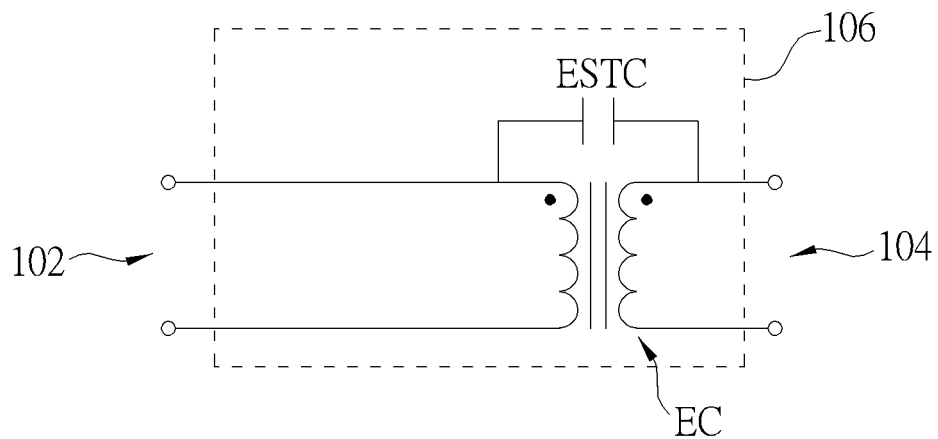
FIG. 2 is an equivalent circuit of the integrated circuit shown in FIG. 1B.

Please refer to FIG. 2, which is an equivalent circuit diagram of the integrated circuit 10 shown in FIG. 1B. As shown in FIG. 2, the electromagnetic transmitting unit 108 comprises the magnetic coil EC and an electronic signal transmitting capacitor ESTC. The magnetic coil EC is utilized for performing transmission of the electronic signal ES. The electronic signal transmitting capacitor ESTC represents an equivalent capacitor between the first signal end 102 and the second signal end 104. Since the space between the first signal end 102 and the second signal end 104 is fully filled by the electromagnetic insulation material (i.e. the electromagnetic insulating layer 110), the capacitance of the electronic signal transmitting capacitor ESTC is increased. As a result, the electro-static protection ability can be effectively improved. In other words, both the electromagnetic interference resistance and the electro-static protection ability can be improved.

Figure 3A:
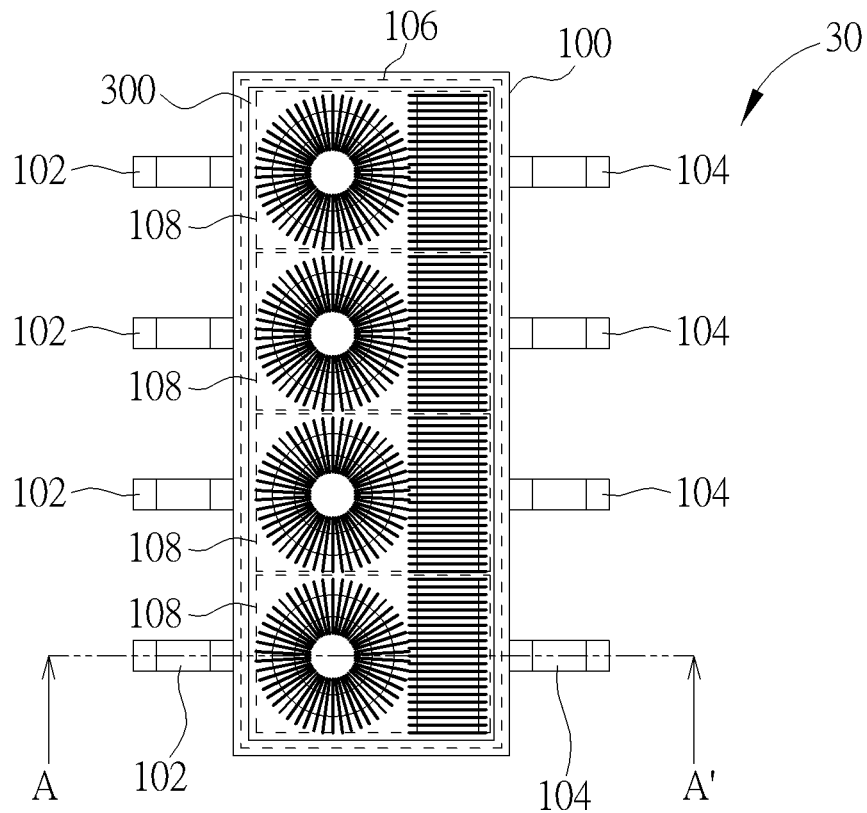
FIG. 3A is a schematic diagram of another integrated circuit according to an embodiment of the present invention.
Figure 3B:
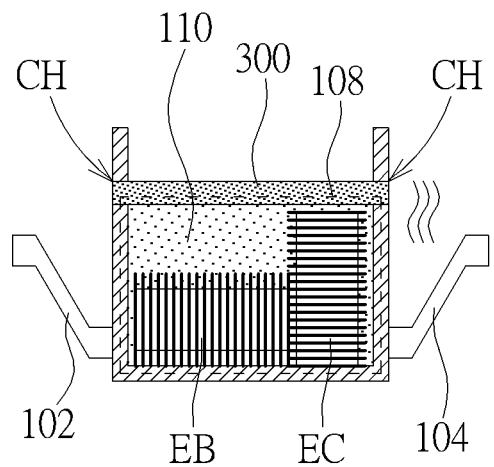
FIG. 3B is a cross-sectional view of the integrated circuit shown in FIG. 3A.

Please refer to FIG. 3A and FIG. 3B, which are schematic diagrams of an integrated circuit 30 according to an embodiment of the present invention. The integrated circuit 30 shown in FIG. 3A and FIG. 3B is similar to the integrated circuit 10 shown in FIG. 1A and FIG. 1B, thus the signals and the components with similar functions use the same symbols. Unlike the integrated circuit 10 shown in FIG. 1A and FIG. 1B, the integrated circuit 30 further stacks an electromagnetic heat-conducting layer 300, coupling to a plurality of cooling holes CH of the housing 100, on the electromagnetic insulating layer 110. The electromagnetic heat-conducting layer 300 can be a thermal grease layer, which can radiate heat rapidly through the cooling holes CH. In such a condition, the electromagnetic insulating layer 110 not only can fix the magnetizer EB and the magnetic coil EC, but also can conduct heat generated when the electromagnetic transmitting unit 108 transmits the electronic signal ES to the electromagnetic heat-conducting layer 300, so as to radiate the heat via the electromagnetic heat-conducting layer 300 and the cooling holes CH. This prevents the integrated circuit 30 from overheating and functioning abnormally.

Figure 4:
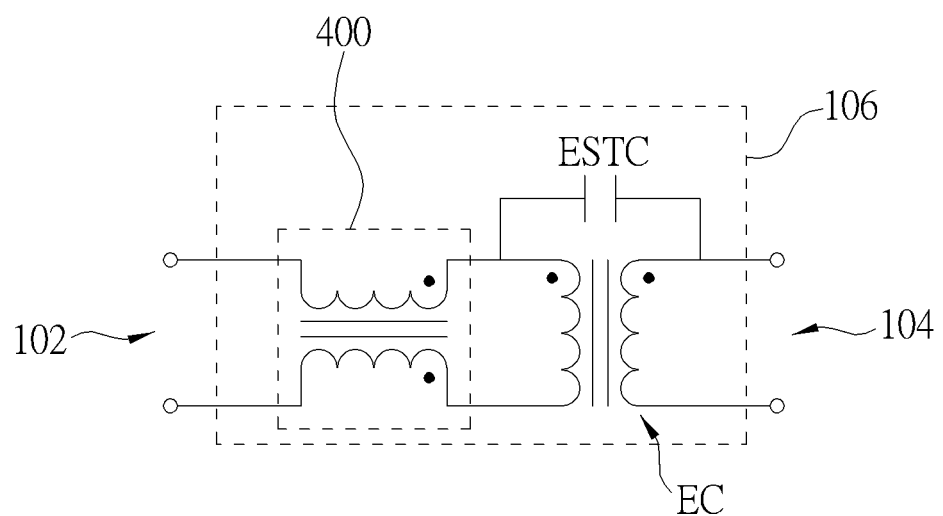
FIG. 4 is another equivalent circuit of the integrated circuit shown in FIG. 1B.

Noticeably, the integrated circuit of the above embodiments utilizes the electromagnetic insulating layer made by electromagnetic insulation material to cover the electromagnetic transmitting unit, for increasing the equivalent capacitance between the first signal ends and the second signal ends. The resistance of the electro-static discharge and the electromagnetic interference of the electronic signal transmitting device can therefore be improved. In another embodiment, the integrated circuit radiates the heat generated when the electronic signal transmitting device transmits the electronic signal via the electromagnetic heat-conducting layer configured in the housing of the integrated circuit and the cooling holes of the housing, for preventing the integrated circuit from working abnormally due to overheating. According to different applications and requirements, those with ordinary skill in the art may observe appropriate alternations and modifications. For example, the electronic signal transmitting device may further comprise a waveform filter unit for filtering the noise of the electronic signal. Please refer to FIG. 4, which is another equivalent circuit diagram of the integrated circuit 10 shown in FIG. 1B. The integrated circuit 10 shown in FIG. 4 is similar to the integrated circuit 10 shown in FIG. 2, thus the components and signals with the similar functions use the same symbols. Unlike FIG. 2, the equivalent circuit shown in FIG. 4 further comprises a waveform filter unit 400 electrically connected between the first signal end 102 and the magnetic coil EC, respectively. The waveform filter unit 400 is utilized for filtering the noise of the electronic signal ES so that the noise of the electronic signal ES can be reduced.

To sum up, the electronic signal transmitting device and the integrated circuit of the above embodiments improve the resistance of electro-static discharge and the electromagnetic interference between the first signal ends and the second signal ends via covering the electromagnetic insulating layer. Furthermore, the electronic signal transmitting device and the integrated circuit of the above embodiments can also improve the heat-radiating ability via adding the electromagnetic heat conducting layer coupled to the cooling holes of the housing, to prevent abnormal functioning of the integrated circuit due to overheating.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic signal transmitting device disposed in a housing of an integrated circuit, the integrated circuit comprising at least one first signal end and at least one second signal end, the electronic signal transmitting device comprising:
   at least one electromagnetic transmitting unit, coupled between the first signal end and the second signal end for transmitting an electronic signal between the first signal end and the second signal end;
   an electromagnetic insulating layer covering the electromagnetic transmitting unit for protecting the integrated circuit from electromagnetic interference; and
   an electromagnetic heat-conducting layer configured in the housing of the integrated circuit, the electromagnetic heat-conducting layer being stacked on the electromagnetic insulating layer and coupled to at least one cooling hole of the housing.

2. The electronic signal transmitting device of claim 1, wherein the electromagnetic transmitting unit comprises:
   a magnetizer; and
   a magnetic coil twining round the magnetizer and coupled to one of the first signal end and one of the second signal end.

3. The electronic signal transmitting device of claim 2, wherein the electromagnetic transmitting unit further comprises:
   a waveform filter unit, electrically connected between one of the first signal ends and the magnetic coil for filtering noise of electronic signals.

4. The electronic signal transmitting device of claim 2, wherein the electromagnetic transmitting unit further comprises:
   an electronic signal transmitting capacitor, electrically coupled between one of the first signal end and one of the second signal end.

5. The electronic signal transmitting device of claim 1, wherein the electromagnetic insulating layer is a varnish layer.

6. The electronic signal transmitting device of claim 1, wherein the electromagnetic heat-conducting layer is a thermal grease layer.

7. An integrated circuit, comprising:
   a housing;
   at least one first signal end, configured at a first side of the housing;
   at least one second signal end, configured at a second side of the housing; and
   an electronic signal transmitting unit, configured in the housing, comprising:
      at least one electromagnetic transmitting unit, coupled between the first signal end and the second signal end, for transmitting an electronic signal between the first signal end and the second signal end; and
      an electromagnetic insulating layer covering the electromagnetic transmitting unit for protecting the integrated circuit from electromagnetic interference; and an electromagnetic heat-conducting layer configured in the housing of the integrated circuit, the electromagnetic heat-conducting layer being stacked on the electromagnetic insulating layer and coupled to at least one cooling hole of the housing.

8. The integrated circuit of claim 7, wherein the electromagnetic transmitting unit comprises:

a magnetizer; and a magnetic coil twining round the magnetizer and coupled to one of the first signal end and one of the second signal end.

9. The integrated circuit of claim 8, wherein the electromagnetic transmitting unit further comprises:

a waveform filter unit, electrically connected between one of the first signal end and the magnetic coil for filtering noise of electronic signals.

10. The integrated circuit of claim 8, wherein the electromagnetic transmitting unit further comprises:

an electronic signal transmitting capacitor, electrically coupled between one of the first signal end and one of the second signal end.

11. The integrated circuit of claim 7, wherein the electromagnetic insulating layer is a varnish layer.

12. The integrated circuit of claim 7, wherein the electromagnetic heat-conducting layer is a thermal grease layer.

* * * * *